United States Patent [19]

Koscica et al.

[11] Patent Number: 5,569,943
[45] Date of Patent: Oct. 29, 1996

[54] FIELD EFFECT REAL SPACE TRANSISTOR

[75] Inventors: Thomas E. Koscica, Clark; Jian H. Zhao, North Brunswick, both of N.J.

[73] Assignee: The United States of America as represented by the Secretary of the Army, Washington, D.C.

[21] Appl. No.: 522,894

[22] Filed: Sep. 1, 1995

[51] Int. Cl.$^6$ ............... H01L 31/0328; H01L 31/0336; H01L 29/80
[52] U.S. Cl. .................... 257/192; 257/194; 257/280
[58] Field of Search ................................ 257/192, 194, 257/280, 281, 282, 283

[56] References Cited

U.S. PATENT DOCUMENTS

| | | | |
|---|---|---|---|
| 4,641,161 | 2/1987 | Kim et al. | 257/192 |
| 4,882,609 | 11/1989 | Schubert et al. | 257/194 |
| 5,323,030 | 6/1994 | Koscica et al. | 257/194 |
| 5,455,441 | 10/1995 | Awano | 257/194 |

*Primary Examiner*—Wael Fahmy
*Attorney, Agent, or Firm*—Michael Zelenka; William H. Anderson

[57] ABSTRACT

A heterostructure semiconductor device having source and drain electrodes resistively coupled to opposite ends of a channel, a barrier layer on one side of the channel, a delta doped layer in the channel or within a given distance of it, a gate electrode on the barrier so as to form a Schottky diode and at least one collector electrode mounted on said barrier layer. The collector electrode or electrodes can be resistively coupled to the barrier layer, but preferably the coupling is such as to form a Schottky diode. Changes to the gate bias affect the source current through the field effect mechanism. The collector current depends on the transfer of heated, energized carriers out of the channel over the front heterobarrier. At low gate bias, electrons entering the source travel to the drain while none travel to the collector. Energized carriers are localized to the depletion region due its high electric field drop. At an intermediate gate bias, source current is increased and the voltage drop along the channel shifts more toward the region below the collector. Some heated carriers are then present at the collector's barrier and transfer out of the channel to the collector. At high bias, carrier heating in the channel causes a large fraction of electrons from the source to transfer to the collector. With a rising gate voltage the drain current goes through a smooth peaking and reduction while the collector current rises monotonically.

15 Claims, 2 Drawing Sheets

FIELD EFFECT REAL SPACE TRANSISTOR

GOVERNMENT INTEREST

The invention described herein may be manufactured, used, sold and/or licensed by or for the Government of the United States of America without payment to us of any royalty thereon.

FIELD OF THE INVENTION

The present invention relates to field effect transistors using real space transfer.

BACKGROUND OF THE INVENTION

A field effect transistor, FET, is generally comprised of a channel that is doped to supply carriers, source and drain electrodes resistively coupled to opposite ends of the channel and a gate electrode that is spaced from the source and drain electrodes and electrically coupled to the channel by a Schottky barrier that effectively forms a diode in which the gate electrode is the anode. As well known, the flow of carriers between the source and drain electrodes is controlled by varying the bias of the gate electrode with respect to the source electrode so as to vary the cross sectional area in the channel through which carriers can pass. Fewer carriers flow when the cross sectional area is reduced than when it is enlarged. An advantage of a FET is that it responds quickly to the variation in the gate electrode bias so as to be useful in high speed switches and in the generation and amplification of high frequency electrical waves.

By adding a collector electrode to a FET between its gate and source electrodes as described in our U.S. Pat. No. 5,323,030 that is incorporated herein by reference, a heterostructure device is provided that is particularly useful in dense logic circuits because it can perform a number of functions e.g. depending on the gate bias it can produce oppositely phased amplified waves as well as complementary outputs at its collector and drain electrodes.

In the field effect real space transistor therein described, source and drain electrodes on top of a barrier layer are resistively coupled to opposite ends of a channel that is supplied with n carriers by bulk doping, and spaced gate and collector electrodes are mounted on the barrier between the source and drain electrodes. The gate electrode is electrically coupled to the barrier by a Schottky junction, and the collector electrode is resistively coupled to the barrier so as to form a mesa structure.

The device of the patent has characteristics wherein there is a desired region of operation in which the drain current, Id, is decreasing and the collector current, Ic, is increasing so as to provide the complementary outputs at the collector and drain previously referred to. The collector current is due to electrons that are transferred from the channel that would ordinarily go to the drain. Unfortunately, however, the desired region of operation only extended in one device to a gate voltage of 0.6 volts at which the device was destroyed by leakage current between the gate and collector. The gate does not supply electrons but some of the electrons that are drawn from the source to the near side of the gate become diffused in the barrier layer and are drawn to the more positive collector. The operating range is also reduced because of leakage of electrons between the gate and collector when the latter is relatively positive.

SUMMARY OF THE INVENTION

An heterostructure device of this invention has the same general structure as the device described in the above identified patent but differs therefrom in two important respects. First, the carriers for the channel are supplied by a delta doping layer that is preferably located in the channel or in the barrier layer as long as it is within a limited distance from the channel such an 100 angstroms. A number of such layers can be used depending on the carrier density desired. The use of a delta doping layer instead of a uniformly doped channel permits the barrier layer to have a higher quality during growth so as to reduce the electron flow between the source and gate described above and permit more positive gate voltages to be used before the device is destroyed. Second, the collector electrode forms a Schottky function so that electrons cannot flow between the collector and drain electrodes when the latter is relatively positive. Changes to the gate bias affect the source current through the field effect mechanism. The collector current depends on the transfer of heated, energized carriers out of the channel over the front heterobarrier. At low gate bias, electrons entering the source travel to the drain while none travel to the collector. Energized carriers are localized to the depletion region due its high electric field drop. At an intermediate gate bias, source current is increased and the voltage drop along the channel shifts more toward the region below the collector. Some heated carriers are then present at the collector's barrier and transfer out of the channel to the collector. At high bias, carrier heating in the channel causes a large fraction of electrons from the source to transfer to the collector. With a rising gate voltage the drain current goes through a smooth peaking and reduction while the collector current rises monotonically.

BRIEF DESCRIPTION OF THE DRAWINGS

Various embodiments of the invention are shown and described herein with reference to the accompanying drawings, in which like items are identified by the same reference designation, wherein.

DETAILED DESCRIPTION OF THE INVENTION

Figure 1:
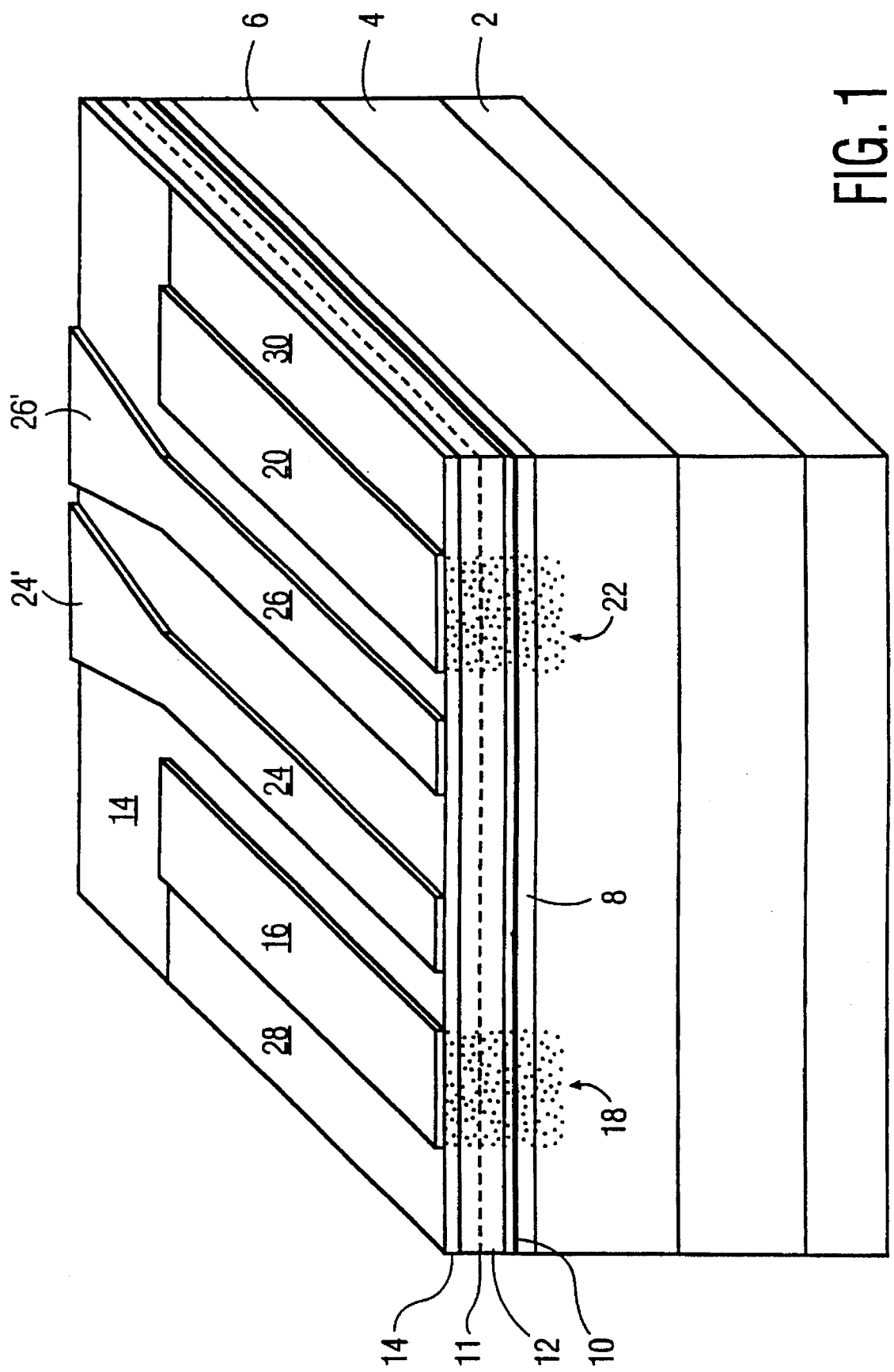
FIG. 1 is an isometric view of a heterostructure device of the invention with the isolating insulation removed.

The heterostructure device shown in FIG. 1 is comprised of a substrate layer 2 of semi-insulating GaAs having a desired thickness, an undoped barrier growth buffer layer 4 of GaAs having any desired thickness, and an undoped barrier layer 6 of Alx Ga(1–x)As, with x being between 0.15 and 0.50 inclusive and preferably 0.4. The thickness of the layer 6 may be between 200 and 1000 and preferably is 500 angstroms. It is also possible to substitute alternate barrier structures such as a multilayer quantum structure to achieve carrier confinement in a channel 8 that is directly above it. The channel layer 8 is comprised of undoped GaAs. Its thickness can be between 75 and 300 angstroms but is preferably between 150 and 200 angstroms. In the device that was used to demonstrate the collector and drain currents shown in FIG. 2, the thickness of the channel layer 8 was 200 angstroms.

In accordance with the invention, carriers, in this case, electrons, are supplied to the channel 8 by a delta doped layer 10 that lies within the channel 8. Although only one delta doped layer is shown, a plurality of them could be used in order to obtain a desired carrier density. Delta layers such as a layer 11 could also be located in a barrier layer 12 that is immediately above the channel 8; the barrier layer 12 is comprised of undoped AlGAs. The thickness of the barrier layer 12 should be between 200 and 800 angstroms, but 400 angstroms was the thickness used in the device that produced the current versus voltage curves of FIG. 2. In any case, a delta layer should be within 100 angstroms of the channel layer 8 to be effective in providing carriers to the channel. Variations in operating characteristics of the device may be obtained by the position of a single delta layer or the positions of a plurality of delta layers. The barrier layer 12 may include a cap layer 14 of undoped GaAs having a thickness of 50 to 100 angstroms to prevent the AlGaAs barrier layer 12 from being exposed to air. In the device for which the currents of FIG. 2 were attained, the thickness of the cap was 100 angstroms. The layers 2, 4 and 6 are referred to herein as a base structure.

A source electrode 16, which is shown as being on the optional cap 14 is resistively coupled as indicated at 18 to one end of the channel layer 8, and a drain electrode 20 that is on top of the optional cap 14 is resistively coupled to the other end of the channel layer 8, as indicated at 22. A Schottky gate electrode 24 and a Schottky collector electrode 26 are shown connected to the optional cap layer 14. In this particular embodiment, the electrodes 16, 20, 24 and 26 are parallel and there is a space between the gate and collector electrodes 24 and 26, a space between the source electrode 16 and the gate electrode 24 and a space between the collector 26 and the drain electrode 20.

Field effect transistors have a threshold voltage that may be shifted by a small amount of delta doping in the cap layer 14 or even in the barrier layer 12, as is conventionally known in the art.

The device of FIG. 1 is isolated from other devices by using conventional oxygen implantation to make all non device regions highly resistive, i.e. to act as an insulator. Alternatively, the devices could be isolated by etching off the active layers surrounding the device from the top down to the layer 6 to form a mesa structure. The source electrode 16 and the drain electrode 20 are formed of ohmic metal, and the gate electrode 24 and the collector electrode 26 are formed with Schottky metal. The gate electrode 24 and the collector electrode 26 extend beyond the source electrode 16 and the drain electrode 20 to form lands 24' and 26' to which electrical connections can be made. In a demonstration by the inventors herein, the Schottky metal was composed of non alloyed layers of titanium and gold (TiAu). The ohmic metal used included Ni:Ge:Au-:Ti:Au::300:500:1200:500:1000 in which the NiGeAu form an alloy under heat and diffuse through barrier layers 12 and 14 to form a conduction path from contact to channel.

The dimensions of the demonstrated prototype of the present invention which produced the current variations of FIG. 1 were as follows: device width= 40 microns; gate length= 2 microns; collector length= 2 microns; gaps between all contacts= 2 microns; and source and drain contact lengths = 5 microns.

Figure 2:
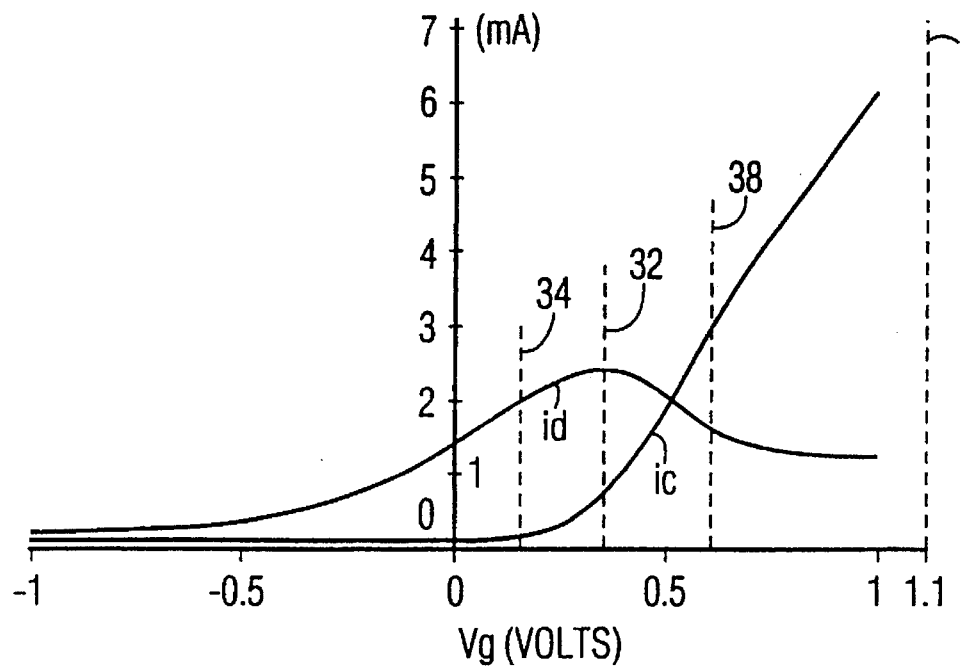
FIG. 2 includes graphs of collector and drain current obtained from a device of the invention.

The manner in which the heterostructure of FIG. 1 produces the drain carrier current Id and collector carrier current curve Ic of FIG. 2 is as follows. The source electrode 16 is at ground potential and the drain electrode 20 is at a suitable positive potential, 15 volts for example. When the voltage of the gate 16 is sufficiently negative with respect to the source 16, the drain current Id will reach a constant value that is due to leakage either along the outside surface of the device or through it. In FIG. 2 this point has not been reached, but it is seen that the current Ic from the collector electrode 26 is a small constant value that is due to leakage.

As the voltage of the gate 16 becomes less negative, the drain current Id gradually increases up to a maximum at the line 32 where the voltage of the gate 16 is about +0.35 volts as indicated. At a slightly lesser gate voltage of about +0.18 volts indicated by a line 34, the collector current Ic starts to rise, and the rate of increase of the drain current Id starts to decrease because electrons that would otherwise go to the drain electrode 20 are diverted or transferred to the collector electrode 26. The voltages at the collector 26 and the drain 20 are such as to produce a strong field in the portion of the channel 8 that is aligned with or under the collector 26 so as to excite the electrons therein sufficiently to permit them to spatially transfer out of the channel and to the collector 26.

Electron flow in the channel 8 causes a potential gradient along the collector 26 that is less positive at the side closer to the source 16 than at the side closer to the drain 20. At any point where the voltage is sufficiently reduced, the contact potential of the Schottky diode formed at the collector 26 is overcome so that electrons can start transferring to the collector 26 as indicated by the portion of Ic between the lines 34 and 32. The electron flow from the source 16 equals the sum of Id and Ic and increases as the voltage of the gate 24 becomes more positive. Therefore, although the increasing electron flow indicated by Ic between the lines 34 and 32 comes from the electrons that would otherwise go to the drain 20, the current Id can continue to increase because the total electron flow from the source 16 is increasing. At the voltage of the gate 24 occurring at the line 32, the increase in the electron flow to the collector 26 equals the total increase in electron flow from the source 16 so that there is no increase in Id. As the voltage of the gate 26 becomes more positive than the voltage at the line 32, the increase in electron flow to the collector 26 is greater than the increase in the current from the source 16 so that Id decreases.

As previously noted, the use of delta doping to supply carriers, which in this case are electrons, to the channel 8 permits the barrier layer 12 to have fewer residual electrons, thereby permitting the voltage at the gate 24 to become more positive before the sum of the residual electrons and those drawn from the source 16 result in an electron flow to the collector 26 sufficient to destroy the device. In a device constructed in accordance with the invention, the gate voltage at which destruction would occur is greater than 1.1 volts as indicated at the line 36 so that the operating range of the gate voltage is nominally between the lines 34 and 36 to achieve the unique functionality of the present device. By comparison, a device constructed in accordance with U.S. Pat. No. 5,323,030 is destroyed at a voltage of 0.6 volts indicated at line 38 so that the operating range of the gate voltage was between the lines 34 and 38 and therefore much smaller.

A number of alternatives that will occur to one skilled in the art are as follows. Different heterostructure materials including those of the ternary and quaternary type could be used without changing the essential features described in the present design, and the heterostructures could be selected to provide a higher barrier height at the channel.

Different ohmic metals could be substituted at the source and drain or Schottky metals could, be substituted for the gate and collector without changing the basic device operation but may provide less resistive losses.

The delta doping can be placed anywhere inside channel 8 or within 100 angstroms outside the edges of channel 8; the delta doping can be divided into several delta dopings to achieve additional control over the electrostatic barrier profile arising from partial channel depletion occurring during real space transfer of carriers out of the channel 8.

The device width can be increased or decreased to give increased or decreased sizes for terminal currents. Alternately, the gate can be arranged into two or more fingers as in a conventional device useful for high current or power applications.

The lateral dimensions of the device can be adjusted to improve the frequency characteristics of the device with the general trend that smaller dimensions tend toward higher frequency operation.

The collector may be different Schottky metal from the gate without altering the fundamental characteristics mentioned herein. Furthermore, other modifications such as heating may be used to alter the Schottky height at the collector. A thin heavily doped layer could be included just below the collector to further alter the Schottky barrier height characteristics.

The thickness of the top barrier 12 between the channel 8 and collector 26 can be made thinner than in the present embodiment to form a barrier which passes current more readily, or thicker than in the present embodiment to increase the voltage swing that can be achieved between the channel 8 and collector 26 before real space transfer occurs.

Figure 3:
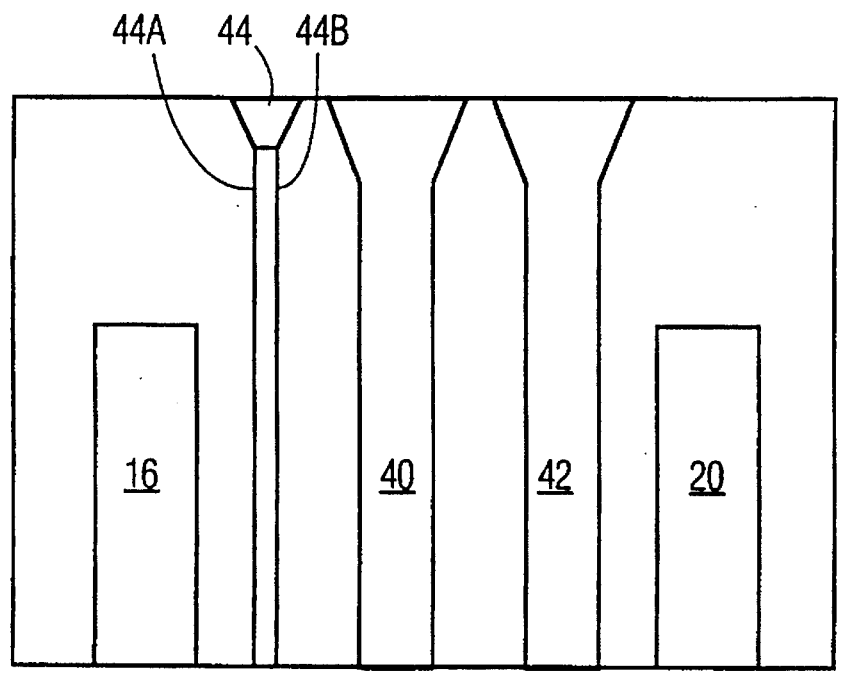
FIG. 3 is a view of the top of a device shown in FIG. 1 having a plurality of collector electrodes.

As illustrated in FIG. 3, more than one collector can be placed between the drain electrode 16 and the gate electrode 20. When two collectors 40 and 42 are used, as shown in FIG. 3, a multiplexing function can be performed among the drain, collector 1, and collector 2. Through adjustment of their relative positions and the barrier thickness, the two or more collectors could be designed to conduct current either at similar or at sequentially higher gate bias voltages. The gate 44 has a plurality of electrically connected fingers 44A and 44B so as to decrease the distance between the source 16 and the drain 20, thus permitting the device to operate faster.

Field effect gates have an associated threshold voltage, $V_+$, which provides the parameters at which gate voltage, Vg, current begins to significantly conduct in the channel beneath. By changing the gate separation from the channel or by doping in or near the channel, $V_+$ can be changed. Lowering the doping or decreasing the gate separation makes $V_+$ more positive while the reverse lowers $V_+$. By designing a device with more negative $V_+$, the crest of the drain current can be made to occur at negative Vg valves.

Although various embodiments of the invention have been shown and described herein, they are not meant to be limiting. Those of skill in the art may recognize certain modifications to these embodiments, which modifications are meant to be covered by the spirit and scope of the appended claims.

What is claimed is:

1. A semiconductor device including:
   a first barrier layer;
   a second barrier layer;
   a channel layer between said first and second barrier layers;
   a source electrode on said second barrier layer resistively coupled to one side of said channel layer;
   a drain electrode on said second barrier layer resistively coupled to the other side of said channel layer;
   a delta doping layer in one of said channel layer and said second barrier layer;
   a gate electrode attached to said second barrier layer in such manner as to form a Schottky diode with said barrier layer;
   a collector electrode attached to said second barrier layer and located between said gate electrode and said drain electrode;
   at least one additional collector electrode on said second barrier layer that is located between said gate electrode and said drain electrode; and
   electrical coupling between said collector electrode and said second barrier layer.

2. A semiconductor device as set forth in claim 1 wherein:
   the electrical coupling of said collector electrode to said second barrier layer is resistive.

3. A semiconductor device as set forth in claim 1 wherein:
   the electrical coupling between said collector electrode and said second barrier layer forms a Schottky diode.

4. A semiconductor device as set forth in claim 1, wherein said channel layer and said barrier layers are made of ternary type material.

5. A semiconductor device as set forth in claim 1 wherein said channel and barrier layers are made of quartenary type material.

6. A semiconductor device as set forth in claim 1 wherein said delta doping layer is in said channel.

7. A semiconductor device as set forth in claim 1, wherein said delta doping layer is in said second barrier layer.

8. A semiconductor device as set forth in claim 1 further comprising:
   at least one additional delta doping layer.

9. A semiconductor device as set forth in claim 7 wherein said delta layer and any additional delta layer are in or within 50 angstroms of said channel.

10. A semiconductor device as set forth in claim 1 wherein said gate electrode has a plurality of fingers.

11. A semiconductor device comprising:
    a base structure;
    a channel layer on said base structure,
    a barrier layer on said channel layer;
    a source electrode on said barrier layer;
    means for providing a resistive connection between said source electrode and said channel layer;
    a drain electrode on said barrier layer, there being a space in between said source and drain electrodes;
    means for providing a resistive connection between said drain electrode and said channel layer;
    means for providing a resistive connection between said source electrode and said channel layer;
    a gate electrode mounted in said space on said barrier layer so as to form a Schottky diode;
    a collector electrode mounted on said barrier layer between said gate electrode and said drain electrode so as to form a Schottky diode;
    at least one additional collector electrode on said barrier layer that is located between said gate electrode and said drain electrode; and
    a delta doping layer within a given distance from said channel layer.

12. A semiconductor device as set forth in claim 11 wherein:

an upper layer of said base structure that is adjacent said channel layer is comprised of AlGa(1−x)As with x being in a range between 0.15 and 0.50.

13. A semiconductor device as set forth in claim 11 wherein:

said channel layer is comprised of undoped GaAs having a thickness in the range of 150 to 300 angstroms.

14. A semiconductor device as set forth in claim 11 wherein:

said barrier layer is comprised of undoped AlGaAs and has a thickness in the range of 200 to 800 angstroms.

15. A semiconductor device as set forth in claim 11 wherein:

said barrier has a cap layer on a surface remote from said channel, said cap layer being composed of undoped GaAs having a minimum thickness of 50 angstroms.

* * * * *